United States Patent [19]

Rubin

[11] Patent Number: 4,939,787
[45] Date of Patent: Jul. 3, 1990

[54] TEMPERATURE CONTROLLED RESISTIVE-LIQUID DUMMY LOAD

[76] Inventor: Irving Rubin, 209 Channel Dr., Monmouth Beach, N.J. 07750

[21] Appl. No.: 237,273

[22] Filed: Aug. 26, 1988

[51] Int. Cl.$^5$ .............................................. H04B 1/72
[52] U.S. Cl. .................................... 455/115; 330/143; 333/22 F
[58] Field of Search ........................ 455/115, 120, 67; 330/2, 50, 143; 333/22 F, 155, 234, 235

[56] References Cited

U.S. PATENT DOCUMENTS

| | | | |
|---|---|---|---|
| 3,617,924 | 11/1971 | Fujita et al. | 333/22 F |
| 3,660,784 | 5/1972 | Scharfman | 333/22 F |
| 3,796,973 | 3/1974 | Klein | 333/22 F |
| 3,906,402 | 9/1975 | Lesyk | 333/22 F |
| 4,262,246 | 4/1981 | Fujii | 455/115 |
| 4,286,238 | 8/1981 | Ursenbach | 333/22 F |
| 4,799,031 | 1/1989 | Lang et al. | 333/22 F |

*Primary Examiner*—Benedict V. Safourek
*Assistant Examiner*—Ralph Smith
*Attorney, Agent, or Firm*—Charles F. Gunderson

[57] ABSTRACT

A dummy load for a radio frequency transmitter uses a resistive liquid within a tube of non-conducting material as the load. The tube has grounded conductors at each end, and a centrally-located terminal that provides a load, with respect to ground, across two parallel branches. The output of the radio frequency transmitter is applied between the centrally-located terminal and ground. The ends of the tube are connected into a closed liquid loop that includes a temperature controlling system with a circulating pump, a heater for raising the temperature of the resistive liquid to a given, operating level, if necessary, and a heat exchanger for lowering the temperature of the resistive liquid to the given, operating level, when necessary; whereby the heat generated by the output of the transmitter can be dissipated, and the temperature of the resistive liquid, within the tube, kept at a constant mean temperature to provide a constant resistance under all load conditions.

7 Claims, 1 Drawing Sheet

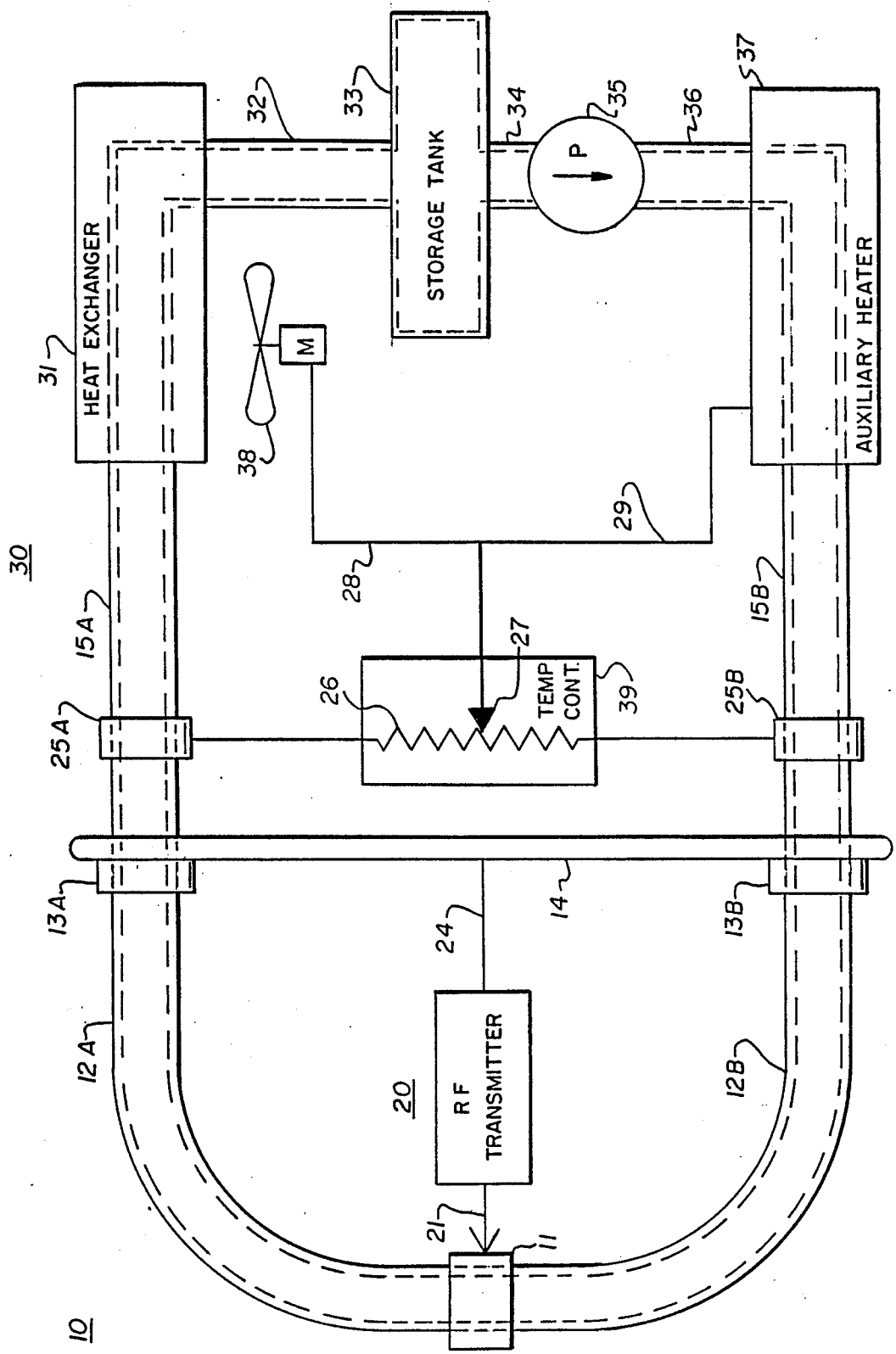

TEMPERATURE CONTROLLED RESISTIVE-LIQUID DUMMY LOAD

BACKGROUND OF THE INVENTION

It is, of course, necessary to load high power transmitters from time to time under controlled conditions for tuning adjustment. This must be at full, or nearly full output power, and this may take a substantial amount of time. During this time, the load should be as close as possible to the required resistance for precise tuning. This requires the use of a resistive dummy load that can accomodate the full output of the transmitter without random atmospheric discontinuities.

The standard dummy loads must be non-inductive, for obvious reasons, and can be of carbon, or other resistive, non-inductive or capacitive material. However, as power is applied to the resistive dummy load, it must heat up, and, with higher-powered transmitters, must be capable of carrying very-high wattages, and considerable heat, for extended periods of time.

This requires heavier duty resistors—of silicon carbide, or the like—that are physically stronger, and can be made in the larger sizes that will be needed for the heavier loads. Even these must be limited by temperature rise, and must be cooled by some means, such as fans, at least, to keep their temperatures at a safe working level, and prevent burnout. As more wattage is applied from the transmitter, more heat must be absorbed, and larger units, or more and more units will be required, connected in series or parallel to dissipate the increasing heat loads. The basic necessity is to carry away the heat generated by the high powered transmitter across the dummy load.

However, the inevitable temperature rise in a dummy load further complicates the problem by the fact that the resistance of the resistors varies with temperature, and a constant temperature and resistance can only be achieved with predictable resistors, cooling fan velocities, and radio frequency power outputs. Any change in any of these factors, or even the ambient temperature, will change the dummy load temperature and resistance, and reduce the accuracy of the tuning process.

Even under stable conditions, precise temperatures can only be maintained under a constant transmitter output, and separate systems would probably be necessary for different transmitters and outputs. The cooling may be varied to some extent, but can only maintain constant temperatures in the resistors over a narrow range of inputs. It would be almost impossible for cooling fans to maintain constant temperatures of resistors over the extremely-wide range of transmitter outputs.

Aside from the almost-imposibility of maintaining a constant temperature over a variety of transmitter outputs, the resistors for a dummy load for a high-powered transmitter would be bulky and heavy, and take up a considerable space for effective heat dissipation. The fans or blowers to cool the resistors would be bulkier and take up even more space.

Water cooling, instead of air cooling, would be ideal, since it hase a much-higher cooling capacity. However, the water must be insulated from the electrical circuitry to avoid short circuits or changes in resistance. This requires a highly-conductive insulation between the resistive material and the water or liquid that must carry away the heat. This would be analogous to automobile engines, where the heat from the combustion chambers must be transmitted through the engine block to the coolant in a relatively non-uniformand inefficient manner. The radiator, on the other hand can be quite efficient. Water-cooled resistors can provide a more compact and efficient dummy load, but they still lack the ability to maintain constant temperatures and resistance over a wide range of transmitter outputs.

It is therefore an object of this invention to provide a dummy load that will maintain its terminal resistance, precisely, under all load conditions, almost indefinitely.

It is a further object of this invention to provide a dummy load that, as a small, compact unit, can absorb a higher wattage of radio frequency energy than banks of conventional resistors, many-more times its size and weight.

It is a further object of this invention to provide a dummy load wherein the resistive load is in liquid form, and the transmitter output load is applied directly to the liquid that can be circulated and temperature-controlled outside of the dummy load, in a conventional manner, to maintain a constant temperature and resistance within the dummy load at all times and under all output loads.

It is a further object of this invention to provide a dummy load that, along with being much smaller and more compact, is very much cheaper to install and operate.

These and other objects are accomplished by the following dummy load system.

SUMMARY OF THE INVENTION

A dummy load for a wide range of transmitter outputs is in the form of a "U"-shaped, hollow, tube of non-conducting material, with a conducting contact at the center of the "U", and conducting contacts at the ends of the "U", which are grounded. A resistive fluid within the tube provides the resistance for the dummy load in two parallel paths between the center, conducting contact and the grounded ends of the "U". However, since the resistance of the fluid will vary with temperature, and a precise resistance is necessary for the dummy load, the tube is connected in series with a temperature controlling system. The resistive fluid from the tube is circulated, by means of a pump, through a heater near the input to raise the temperature of the fluid, if necessary, to an optimum temperature, and through a heat exchanger at the output to lower the temperature, when necessary, to maintain the temperature of the resistive fluid within the dummy load at a constant level under all conditions. In operation, the power applied across the dummy load will heat the liquid, but the flow of the liquid through the heat exchanger will remove the heat applied to the dummy load, and maintain the temperature and the resistance of the load constant. Sensors in both the input and the output lines of the fluid circulating loup will control the action of heater and the heat exchanger, and keep the mean temperature of the fluid—at the center of the loop—at the precise amount to maintain the exact resistance of dummy load.

BRIEF DESCRIPTION OF THE DRAWINGS

The FIGURE is a block diagram of a typical embodiment of this invention.

DETAILED DESCRIPTION OF THE DRAWINGS

Referring now to the figure, a dummy load 10 is shown having a terminal and contact 11 centrally-located between the arms 12A and 12B of a "U" shaped, tube of non-conducting material whose ends form the terminals and contacts 13A and 13B that are connected to a ground 14. The two arms, filled with resistive fluid, not shown, form the dummy load.

A radio frequency transmitter 20, to be tuned or adjusted, has output connections 21 and 24 coupled to the terminals 11 and 14, respectively, of the dummy load.

In this dummy load, the resistance is provided by a resistive liquid chemical solution in the arms 12A and 12B of the non-conducting tubing. These arms are connected in parallel between the centrally-located conductor terminal 11 and grounded conductors of the terminals 13A and 13B.

In this device, the tubing of the dummy load is coupled into a closed liquid circuit through a control unit 30, that includes a heat exchanger 31, a storage tank 33, a circulating pump 35, and an auxilliary heater 37. A fan 38 is positioned adjacent to the heat exchanger to drive cooling air through the heat exchanger on demand.

Tube 15A couples the output 13A of the arm 12A of the dummy load to the input of the heat exchanger 31 of the control unit 30; tube 32 couples the output of the heat exchanger to the input of the storage tank 33; tube 34 couples the output of the storage tank to the input of the circulating pump 35; tube 36 couples the output of the circulating pump to the input of the auxillary heater 37; and tube 15B couples the output of the auxilliary heater to the input 13B of the arm 12B of the dummy load.

A temperature sensitive device, or sensor, 25A should be positioned in the output tube 15A, adjacent to the output of the dummy load, and another temperature-sensitive device, or sensor 25B should be positioned in the input tube 15B, adjacent to the input of the dummy load. A temperature-sensitive control 39 monitors the outputs of the sensors 25A and 25B and may include a potentiometer device 26 that can be bridged between the outputs of the two sensors, with a control 27 to be calibrated to register the mean temperature within the dummy load. This control 27 may be connected through 28 to activate the fan 38 when the mean temperature rises above the prescribed level, that provides the exact resistance, and through 29 to activate the auxilliary heater when the mean temperature falls below the prescribed level.

In practice, the unit is filled with a salt solution whose resistive/temperature characteristics are known, and will provide the desired resistance in the parallel circuit provided. The diameter and lengths of the tubes, and the concentration of the salt solution will be taken into account, along with the operating temperature. The solution is circulated through the system to maintain the operating temperature at all times and under any loads.

One of the many advantages of this system is that an artificially-high operating temperature can be chosen to increase the effeciency of the heat exchanger and provide a more precise temperature control and more-precise resistance with a smaller heat exchanger. This reduces the size of the overall dummy load. However, while the transmitter power, under higher, and normal loads will raise the temperature of the liquid above the operating level, lower level transmitters may not bring up the temperature of the liquid, and the auxillary heater 37 will be necessary to maintain the operating temperature and the correct resistance of the dummy load. Since the system will work best at a temperature somewhat above ambient temperature, the auxilliary heater may first be activated to bring the solution up to the prescribed temperature to provide the desired resistance under no load or light load conditions at all times.

The radio frequency output of the transmitter is connected between the central terminal 11 and the grounded terminals at 14 of the dummy load. The radio frequency energy will additionally heat up the resistive fluids, and the sensors in the input and output arms will be energized to activate the cooling fan 38, associated with the heat exchanger 31, when the temperature rises above the prescribed level, to cool the resistive fluids enough to keep the mean temperature of the fluids within the loop constant and to maintain the resistance constant. When the system has run long enough to stabilize the temperature and resistance, the transmitter can be tuned.

Since a high operating temperature is desirable for efficiency and economy, the auxilliary heater can bring the temperature of the liquid, in a no-load condition, up to operating temperature and resistance, to be ready for instant use with any low or high power transmitters.

The heat exchanger can be of any conventional design, although it must, obviously, be of enough capacity to handle the maximum amount of heat that will be generated. The storage tank, circulating pump, and heater must also be adequate for their prescribed functions. All of the elements must be as resistant as possible to any corrosive or chemical reaction with the solutions within the liquid loop at the temperatures that must be accomodated.

Since there will be a temperature differential between the input and output of the fluids in the dummy load, and the resistance of the fluids varies with temperature, there must be a difference in the resistances of the two arms, and one arm will be hotter than the other. If this is significant, the input point 11 can be adjusted to provide equal resistances and equal heat generated in both halves of the load.

Alternatively, the diameters of the tubes in either half of the loop could also be tapered, or varied, to provide equal resistances in both halves of the parallel circuit in spite of temperature differences in the fluid.

The potentiometer should also be adjusted or calibrated to reflect the true mean temperature of the solution within the dummy load, and thereby maintain the precise resistance required.

The shape of the tubing from the ground couplings to the central contact should not be critical as long as it remains purely resistive. The "U"-shaped configuration suggested and shown is simple and brings the ground terminals together without excessive resistance to the fluid flow. However, the tube could be straight, or even circular, to reduce the turbulance in the flow of the resistive liquid.

This should be taken into account, along with the higher operating temperature, in increasing effeciency. The higher the velocity of the flow of the resistive liquid, the greater the amount of heat carried away from the dummy load. Turbulence should, obviously, be minimised, and sharp bends in the fluid lines, at the "U" turn or elsewhere, should be avoided.

Mechanical and electrical expediency should be taken into account for safety, effeciency, and simplicity.

The size and length of the tubing and of the overall device itself must be such that, besides providing a given resistance, it can carry enough liquid, through the entire system, at enough velocity, to absorb and then dissipate the anticipated heat energy.

The operating temperature chosen, as noted, should be well above ambient temperature—but within the safe limits of the fluids and chemicals involved—to provide a temperature gradient with respect to the ambient fan air temperature that will make the heat exchanger more efficient. As noted, the auxilliary heater can provide the initial raising of the temperature.

There are innumerable types of salts that are resistive in solutions. These can all be found, along with their resistance/temperature, and other characteristics for varying densities in well known chemical handbooks. The choice should be of a salt that is the most stable, and least corrosive, at the temperatures involved, and that will provide the desired dummy-load resistance.

I claim:

1. A resistive unit for a dummy load for a radio frequency transmitter comprising; a tube of non-conductive material having electrically-conducting end terminals on either end connected to a common ground; a centrally-located electrical terminal within said tube between said end terminals; a resistive fluid within said tube to provide resistances in parallel between said centrally-located terminal and ground; a radio frequency transmitter; means for applying the output of said radio frequency transmitter between said centrally-located terminal and ground; and means for controlling the temperature of said resistive fluid within said tube of non-conductive material, to maintain said resistive fluid at a given temperature, that will maintain a constant resistance between said centrally-located terminal and ground for all output loads of said radio frequency transmitter.

2. A resistive unit for a dummy load, as in claim 1, wherein said means for controlling the temperature of said resistive fluid within said tube comprises a temperature controlling unit for fluids connected in series with said tube, in a closed loop; said temperature controlling unit having a heater for warming said fluid, a heat exchanger for cooling said fluid; a pump for circulating said fluid through said tube and said temperature controlling unit; and temperature-sensitive means within said temperature controlling unit for actuating said heater or said heat exchanger to maintain the temperature of said fluid at a constant, given level.

3. A resistive unit for a dummy load, as in claim 1, wherein said tube of non-conductive material is bent in a "U" shape to place said electrically-conducting end terminals side by side on said common ground.

4. A resistive unit for a dummy load as in claim 2, wherein said temperature-sensitive means includes a first temperature sensor near one end of said tube; a second temperature sensor near the other end of said tube; means for connecting said sensors together, and means for establishing a mean temperature differential between said first and second sensors to control said heater and said heat exchanger to maintain said temperature at said given level.

5. A resistive unit for a dummy load, as in claim 2 wherein said heater is actuated by said temperature-sensitive means, if necessary, to bring the temperature of said resistive fluid up to said given level, and said heat exchanger is actuated, by said temperature-sensitive means, when necessary, to bring the temperature of said resistive fluid down to said given temperature.

6. A resistive unit for a dummy load, as in claim 2 wherein said heat exchanger is a radiator, through which said resistive fluid is circulated, said radiator having a cooling fan, actuated by said temperature-sensitive means, when necessary, to reduce the temperature of said resistive fluid to said given temperature.

7. A resistive unit for a dummy load, as in claim 2 wherein said given temperature for said resistive fluid is well above the ambient temperature, to increase the effeciency of said heat exchanger, but below the boiling point of said resistive fluid.

* * * * *